United States Patent
Yu et al.

(10) Patent No.: US 7,449,970 B2
(45) Date of Patent: Nov. 11, 2008

(54) FREQUENCY TUNING CIRCUITS AND VOLTAGE-CONTROLLED OSCILLATOR INCLUDING THE SAME

(75) Inventors: Jin-Hyuck Yu, Hwaseong-si (KR); Je-Kwang Cho, Seongnam-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 35 days.

(21) Appl. No.: 11/416,408

(22) Filed: May 2, 2006

(65) Prior Publication Data
US 2007/0040625 A1 Feb. 22, 2007

(30) Foreign Application Priority Data
May 4, 2005 (KR) ............... 10-2005-0037581

(51) Int. Cl.
*H03B 5/18* (2006.01)
(52) U.S. Cl. .............. 331/177 V; 331/117 R; 331/167; 331/36 C
(58) Field of Classification Search ........... 331/36 C, 331/108 R, 117 R, 117 FE, 108 A, 108 C, 331/167, 177 R, 177 V, 185, 186
See application file for complete search history.

(56) References Cited

U.S. PATENT DOCUMENTS

| 6,211,745 B1 | 4/2001 | Mucke et al. | |
| 6,239,665 B1 * | 5/2001 | Strom | 331/117 FE |
| 6,566,966 B1 * | 5/2003 | Bellaouar et al. | 331/10 |
| 6,995,626 B2 * | 2/2006 | Oehm et al. | 331/177 V |
| 7,129,801 B2 * | 10/2006 | Wu | 331/177 V |
| 2005/0030116 A1 * | 2/2005 | Takagi | 331/177 V |
| 2005/0190002 A1 * | 9/2005 | Takinami et al. | 331/117 R |
| 2006/0197623 A1 * | 9/2006 | Loke et al. | 331/177 V |

FOREIGN PATENT DOCUMENTS

| DE | 102 09 517 | 6/2003 |
| DE | 102004008706 | 9/2005 |
| GB | 2 379 104 | 2/2003 |
| JP | 11-008514 | 1/1999 |
| JP | 2003-078348 | 3/2003 |
| JP | 2003-229718 | 8/2003 |
| KR | 2001 0110468 | 12/2001 |

OTHER PUBLICATIONS

English Abstract for Publication No. 2003-229718.
U.S. Patent No. 6,995,626 (corresponding to DE 102 09 517 A 1).
English Abstract for Publication No. DE 10 2004 008 706.
English Abstract for Publication No. 2001-0110468.

* cited by examiner

*Primary Examiner*—Robert J. Pascal
*Assistant Examiner*—Ryan J. Johnson
(74) *Attorney, Agent, or Firm*—F. Chau & Associates, LLC.

(57) ABSTRACT

A frequency fine tuning circuit for use in a voltage-controlled oscillator is provided. The frequency tuning circuit includes a first varactor, a second varactor and a center bias unit. The second varactor is coupled to the first varactor at a first node. The center bias unit maintains a node voltage of the first node at a constant bias voltage level.

33 Claims, 10 Drawing Sheets

FREQUENCY TUNING CIRCUITS AND VOLTAGE-CONTROLLED OSCILLATOR INCLUDING THE SAME

CLAIM FOR PRIORITY

This application claims priority under 35 USC § 119 to Korean Patent Application No. 2005-37581, filed on May 4, 2005, the disclosure of which is hereby incorporated by reference herein in its entirety.

BACKGROUND OF THE INVENTION

1. Field of the Invention

The present invention relates to frequency tuning circuits and a voltage-controlled oscillator, and more particularly to a fine tuning circuit, a coarse tuning circuit and a voltage-controlled oscillator including the same that may operate efficiently and stably.

2. Description of the Related Art

Due to the widespread use of mobile communication, mobile communication terminals capable of offering better quality service are in demand. For instance, a voltage-controlled oscillator (VCO) is one of the devices that is used for mobile communication terminals, such as e.g., for a wideband receiver. Also, the performance of the voltage-controlled oscillator significantly affects the quality of the mobile communication.

It is preferable that the voltage-controlled oscillator have a wide frequency tuning range and a low noise transmission. Such characteristics become more significant when the voltage-controlled oscillator is utilized at the front end of a mobile communication terminal, where noise may be transmitted through e.g., an antenna, or a digital cable.

A voltage-controlled oscillator includes an active circuit, an LC tank for frequency oscillation and a tuning circuit for tuning an oscillation frequency. The tuning circuit may be divided into a coarse tuning circuit and a fine tuning circuit.

Moreover, the tuning circuit may be implemented in a variety of forms. For example, a conventional tuning circuit typically includes a diode having a variable capacitance, wherein the diode has a structure of a p+/n− well junction. However, the above conventional tuning circuit may not achieve a higher Q value due to the use of the diode, and thus the performance of the tuning circuit may be lowered.

To overcome the above difficulty, an accumulation MOS (AMOS) varactor has been adopted for use in a tuning circuit.

Figure 1:
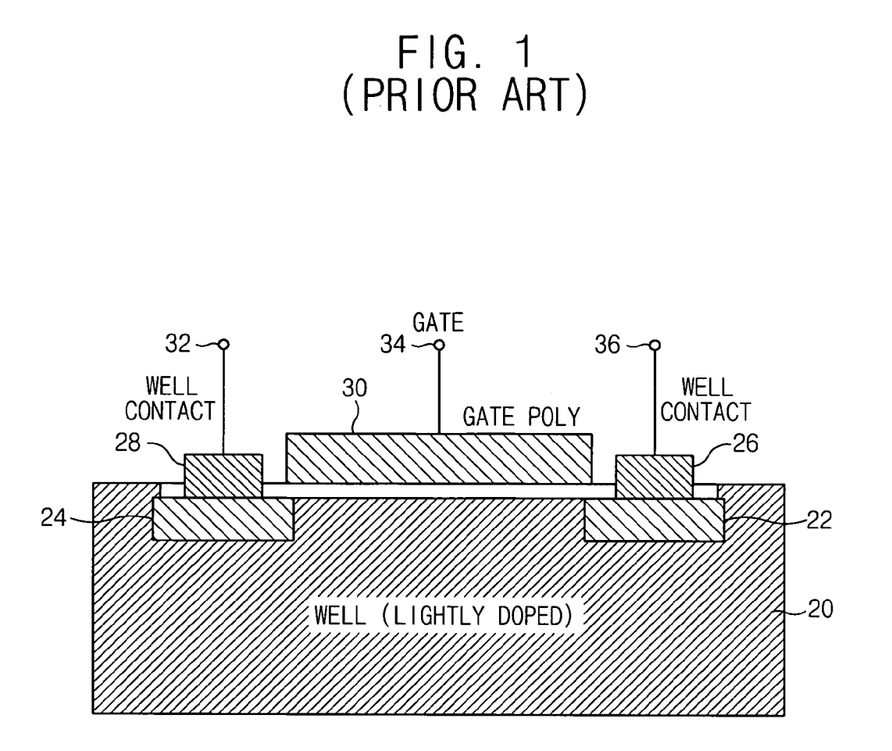
FIG. 1 is a cross-sectional view illustrating a typical structure of a conventional accumulation MOS (AMOS) varactor.

FIG. 1 is a cross-sectional view illustrating a conventional structure of an AMOS varactor, which is also described in U.S. Pat. No. 6,211,745.

Referring to FIG. 1, the AMOS varactor may have a P-type gate formed on an N-type well (hereinafter, referred to as a P-Gate/N-well structure) or an N-type gate formed on a P-type well (hereinafter, referred to as an N-gate/P-well structure).

When the AMOS varactor has the P-gate/N-well structure, a source region 24 and a drain region 22 of the varactor are N$^+$ types regions and well 20 of the varactor is an N$^-$ type well. Additionally, gate poly 30 of the P-type gate is of a P$^+$ type conductivity and contacts 26 and 28 are composed of metal. A P-gate terminal 34 is connected to gate poly 30, and contact terminals 32 and 36 are connected to contacts 28 and 26, respectively. Moreover, when the AMOS varactor has the N-gate/P-well structure, the source region 24 and the drain region 22 are P$^+$ types regions and the well 20 is a P$^-$ type well. Furthermore, gate poly 30 has an N$^+$ type conductivity and contacts 26 and 28 are composed of metal.

Figure 2:
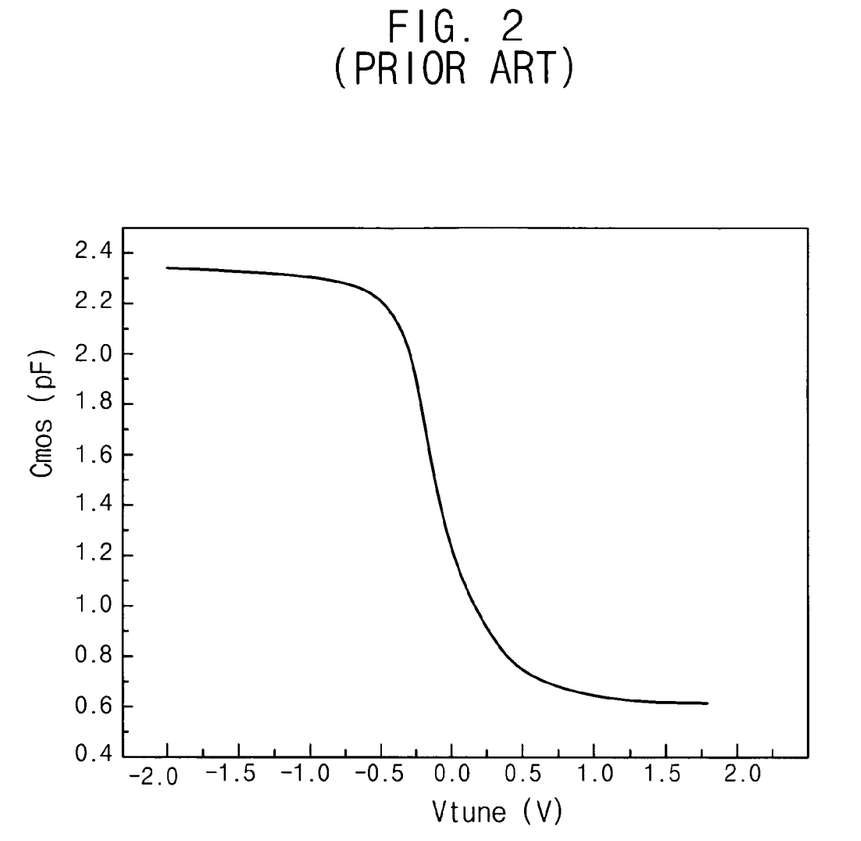
FIG. 2 is a graph illustrating a tuning characteristic of the conventional AMOS varactor in FIG. 1.

FIG. 2 is a graph illustrating a tuning characteristic of the conventional AMOS varactor in FIG. 1. FIG. 2 shows that the capacitance Cmos of the AMOS varactor is varied according to a tuning voltage Vtune ranging from −2V to +2V, As shown in FIG. 2, the capacitance Cmos of the AMOS varactor exhibits a significant change with respect to the tuning voltage Vtune ranging from about −1V to about 1V. In contrast, the capacitance Cmos of the AMOS varactor exhibits little change with respect to the tuning voltage Vtune outside of the range of about −1V to about 1V.

Figure 3:
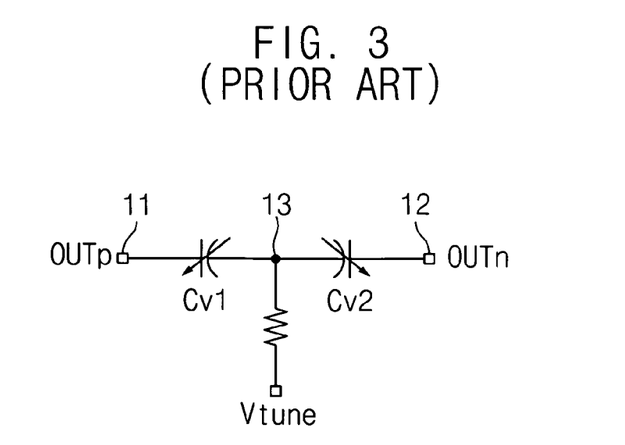
FIG. 3 is a circuit diagram illustrating a conventional fine tuning circuit.

FIG. 3 is a circuit diagram illustrating a conventional fine tuning circuit. The conventional fine tuning circuit in FIG. 3 is also described in U.K. Patent Application No. GB2379104, Japan Patent Laid-Open Publication No. 2003-229718.

Referring to FIG. 3, the conventional fine tuning circuit includes a first varactor Cv1 and a second varactor Cv2 that are serially coupled to each other. The first varactor Cv1 and the second varactor Cv2 may include an AMOS varactor.

The first and second varactors Cv1 and Cv2 have gate terminals coupled to a first output terminal 11 and a second output terminal 12, respectively and source/drain terminals coupled to a tuning voltage input node 13 through which a tuning voltage Vtune is inputted. In addition, the first and second output terminals 11 and 12 correspond to an oscillation node of a voltage-controlled oscillation node.

The tuning voltage Vtune has a voltage level ranging from about 0V to a power supply voltage (VDD). For example, the power supply voltage may have a voltage level of about 2.8V. Moreover, the capacitance of the first varactor Cv1 and the second varactor Cv2 are varied according to the tuning voltage Vtune.

However, as shown in the graph of FIG. 2, the AMOS varactor exhibits a significant change in the capacitance with respect to the tuning voltage Vtune ranging from about −1V to about 1V. In contrast, the AMOS varactor exhibits little change in capacitance with respect to the tuning voltage Vtune outside of the range of about −1V to about 1V.

When a tuning voltage Vtune ranging from about 0V to about 2.8V is inputted, the capacitance tuning range of the AMOS varactor of less than 0V (for example, −1V) may not be produced. Consequently, the capacitance tuning range of the AMOS varactor may be reduced, by about one half of the full capacitance tuning range of the AMOS varactor, thereby rendering about half of the full capacitance tuning range of the AMOS varactor unavailable.

Therefore, in order to use the full capacitance tuning range of the AMOS varactor, the tuning voltage Vtune needs to range from a negative voltage level to a positive voltage level. However, in actual use, the tuning voltage Vtune may have a voltage range between ground and a power supply voltage (VDD).

In the conventional fine tuning circuit depicted in FIG. 3, a DC voltage outputted from the first and second output terminals 11 and 12 is provided to the first and second varactors Cv1 and Cv2 so that the capacitances of the first and second varactors Cv1 and Cv2 may vary according to the DV voltage outputted from the first and second output terminals 11 and 12.

Consequently, when a common noise is introduced to the DC voltage outputted from the first and second output terminal 11 and 12, the capacitances of the first and second varactors Cv1 and Cv2 may be modulated so that phase noise degradation may occur due to an FM modulation.

As described above, in the conventional fine tuning circuit, the capacitance tuning range of the AMOS varactor may be reduced. Moreover, the conventional fine tuning circuit may suffer degradation in performance due to, for example, phase noise degradation caused by noise introduced from the output terminal.

Additionally, the above difficulties may arise not only in the fine tuning circuit but also in a coarse tuning circuit, which has a circuit configuration very similar to the fine tuning circuit.

Thus, there is a need for a frequency fine tuning circuit, and/or a frequency coarse tuning circuit for use with a voltage-controlled oscillator, in which the capacitance tuning range of a varactor is increased while phase noise degradation due to an FM modulation is prevented.

SUMMARY OF THE INVENTION

Some example embodiments of the present invention provide a frequency fine tuning circuit in which the capacitance tuning range of a varactor is increased while phase noise degradation due to an FM modulation is prevented.

Some example embodiments of the present invention m also provide a frequency coarse tuning circuit in which the capacitance tuning range of a varactor is increased while phase noise degradation due to an FM modulation is prevented.

Some example embodiments of the present invention also provide a voltage-controlled oscillator having a frequency fine tuning circuit and/or a frequency coarse tuning circuit in which the capacitance tuning range of a varactor is increased while phase noise degradation due to an FM modulation is prevented.

In some example embodiments of the present invention, a frequency fine tuning circuit for a voltage-controlled oscillator includes a first varactor, a second varactor and a center bias unit. The second varactor is coupled to the first varactor at a first node. The center bias unit maintains a node voltage of the first node at a constant bias voltage level. The first and second varactors may include accumulation MOS (AMOS) varactors.

In further example embodiments, the frequency fine tuning circuit may further include a first blocking capacitor coupled between a first output terminal and the first varactor and configured to prevent noise being transmitted to the first varactor, and a second blocking capacitor coupled between a second output terminal and the second varactor and configured to prevent noise being transmitted to the second varactor. The first and second blocking capacitors may include metal-insulator-metal (MIM) capacitors.

In further example embodiments, a first tuning voltage inputting terminal for providing a tuning voltage may be electrically coupled to a node where the first blocking capacitor and the first varactor are coupled, Also, the first varactor is configured for having the capacitance varied according to the tuning voltage. A second tuning voltage inputting terminal for providing a tuning voltage may be electrically coupled to the node where the second blocking capacitor and the second varactor are coupled. Moreover, the second varactor is configured for having the capacitance varied according to the tuning voltage.

In additional example embodiment, the center bias unit may include a bias voltage generating unit coupled to the first node and configured to determine a voltage level of the first node, as well as a switch unit configured to supply a power supply voltage to the bias voltage generating unit in response to a voltage-controlled oscillation enable signal that is externally provided.

Furthermore, the bias voltage generating unit may include a diode and a resistor that is serially coupled to each other. The bias voltage generating unit may include at least one diode serially coupled. Alternatively, the bias voltage generating unit may include a resistor.

In further example embodiments, the capacitance of the first varactor and the capacitance of the second varactor may be varied according to the tuning voltage ranging from a ground voltage level to a power supply voltage level. The voltage level at the first node may be maintained at one half of a power supply voltage.

In some example embodiments of the present invention, a frequency coarse tuning circuit for use in a voltage-controlled oscillator may include a first varactor, a first blocking capacitor, a second varactor, a second blocking capacitor and a center bias unit. The first varactor is configured to have the capacitance varied according to a bit value externally inputted. The first blocking capacitor is coupled between a first output terminal and the first varactor and configured to prevent noise from being transmitted to the first varactor. The second varactor is configured to have the capacitance varied according to the bit value externally inputted and the second varactor is coupled to the first varactor at a first node. The second blocking capacitor is coupled between a second output terminal and the second varactor and configured to prevent noise from being transmitted to the second varactor. The center bias unit maintains a node voltage of the first node at a constant bias voltage level.

In further example embodiments, the first and second varactors include accumulation MOS (AMOS) varactors, and the first and second blocking capacitors may include metal-insulator-metal (MIM) capacitors.

The first data input terminal may be coupled to a node where the first varactor and the first blocking capacitor are coupled, and the bit value may be inputted through the first data input terminal. A second data input terminal may be coupled to a node where the second varactor and the second blocking capacitor are coupled, and the bit value may be inputted through the second data input terminal. The first and the second data input terminals may be coupled to an inverter so that an inverted bit value is outputted.

In further example embodiments, a logic low level of the bit value may be a ground voltage level, and a logic high level of the bit value may be a power supply voltage level. The voltage level at the first node may be maintained at one half of a power supply voltage. Therefore, the first and second varactors may be controlled by the one half of a power supply voltage.

In some example embodiments of the present invention, a voltage-controlled oscillator may include an active circuit, an inductor and a fine tuning circuit. The active circuit has a first oscillation node and a second oscillation node. The inductor is coupled between the first and second oscillation nodes. The fine tuning circuit is coupled between the first and second oscillation nodes. The fine tuning circuit includes a first varactor configured to have the capacitance varied according to a tuning voltage externally provided, a second varactor coupled to the first varactor at a first node where the second varactor is configured to have the capacitance varied according to the tuning voltage, and a center bias unit configured to maintain a node voltage of the first node at a constant bias voltage level.

In further example embodiments, the fine tuning circuit may further include a first blocking capacitor coupled between the first oscillation node and the first varactor and configured to prevent noise being transmitted to the first varactor, and a second blocking capacitor coupled between the second oscillation node and the second varactor and configured to prevent noise being transmitted to the second varactor.

In additional example embodiments, a voltage-controlled oscillator may include an active circuit, an inductor and at least one coarse tuning circuit. The active circuit may have a first oscillation node and a second oscillation node. The inductor may be coupled between the first and second oscillation nodes. The at least one coarse tuning circuit may be coupled between the first and second oscillation nodes. Moreover, the at least one coarse tuning circuit includes a first varactor, a second varactor and a center bias unit. Further, the first varactor may be configured to have the capacitance varied according to a bit value externally provided. The second varactor may be configured to have the capacitance varied according to the bit value, and may be coupled to the first varactor at a first node. The center bias unit may maintain a node voltage of the first node at a constant bias voltage level.

BRIEF DESCRIPTION OF THE DRAWINGS

The present invention will become more apparent to those of ordinary skill in the art by describing, in detail, example embodiments thereof with reference to the attached drawings, wherein like elements are represented by like reference numerals, which are given by way of illustration only and thus do not limit the example embodiments of the present invention.

DESCRIPTION OF THE EXAMPLE EMBODIMENTS OF THE INVENTION

Hereinafter, the example present invention will be explained in detail with reference to the accompanying drawings.

Figure 4:
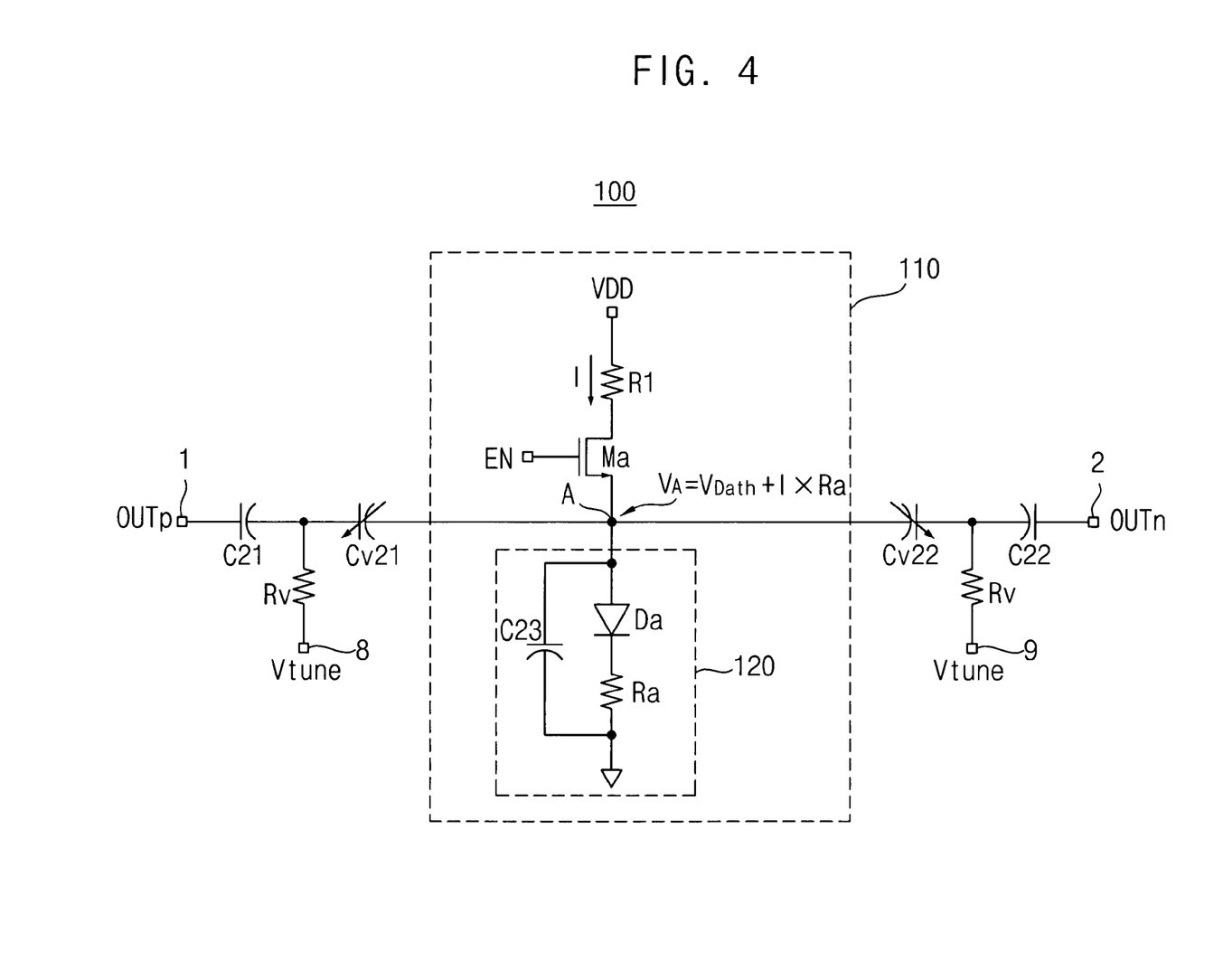
FIG. 4 is a circuit diagram illustrating a fine tuning circuit of a voltage-controlled oscillator according to an example embodiment of the present invention.

FIG. 4 is a circuit diagram illustrating a structure of a fine tuning circuit 100 of a voltage-controlled oscillator according to an example embodiment of the present invention.

Herein, a gate terminal of the varactor may be referred to as a first terminal and source. Also, a drain terminal may be referred herein to as a second terminal. The above definitions may similarly be applied with regard to a blocking capacitor.

Referring to FIG. 4, the fine tuning circuit 100 according to an example embodiment of the present invention may include a first blocking capacitor C21, a first varactor Cv21, a second blocking capacitor C22, a second varactor Cv22 and a center bias unit 110.

The first and second varactors Cv21 and Cv22 may include an accumulation MOS (AMOS) varactor and the first and second blocking capacitors C21 and C22 may include a metal-insulator-metal (MIM) capacitor.

The first varactor Cv21 is serially connected to the first blocking capacitor C21. The first varactor Cv21 has a first terminal electrically coupled to a second terminal of the first blocking capacitor C21 and a second terminal electrically coupled to a second terminal of the second varactor Cv22.

A node between the first varactor Cv21 and the first blocking capacitor C21 is electrically connected to a first tuning voltage inputting terminal 8 through which a tuning voltage Vtune for adjusting the capacitance of the first varactor Cv21 is provided. A resistor may be coupled to the first tuning voltage inputting terminal 8. Therefore, the capacitance of the first varactor Cv21 may be varied according to the tuning voltage Vtune inputted from the first tuning voltage inputting terminal 8.

The first blocking capacitor C21 has a second terminal electrically coupled to the first terminal of the first varactor Cv21 and a first terminal coupled to a first output terminal 1. Herein, the first blocking capacitor C21 may function to block a DC component outputted from the first output terminal 1 so that the first varactor Cv21 may not receive any noise.

The second varactor Cv22 is serially coupled to the second blocking capacitor C22. Herein, the second varactor Cv22 has a first terminal electrically coupled to a second terminal of the second blocking capacitor C22 and a second terminal electrically coupled to the second terminal of the first varactor Cv21.

A node between the second varactor Cv22 and the second blocking capacitor C22 is electrically connected to a second tuning voltage inputting terminal 9 through which the tuning voltage Vtune for adjusting the capacitance of the second varactor Cv22 is provided. A resistor Rv may be coupled between the second tuning voltage inputting terminal 9 and a node where the second varactor Cv22 and the second blocking capacitor C22 are coupled. Therefore, the capacitance of the second varactor Cv22 may be varied according to the tuning voltage Vtune inputted from the second tuning voltage inputting terminal 9.

The second blocking capacitor C22 has a second terminal electrically coupled to the first terminal of the second varactor Cv22 and a first terminal coupled to a second output terminal 2. Herein, the second blocking capacitor C22 may function to block a DC component outputted from the second output terminal 2 so that the second varactor Cv22 may not receive any noise.

Thus, the first blocking capacitor C21 and the first varactor Cv21 form a symmetric structure and the second blocking capacitor C22 and the second varactor Cv22 form a symmetric structure.

A bias node A is formed between the first and second varactors Cv21 and Cv22. A voltage level of the bias node A is maintained constant by a center bias unit 110.

The center bias unit 110 may include a MOS transistor Ma and a bias voltage generating unit 120 for determining a voltage level of the bias node A. The MOS transistor Ma may have a drain terminal electrically coupled to a power supply voltage VDD, a source terminal electrically coupled to the bias node A and a gate terminal for receiving a voltage-controlled oscillator enable signal EN. The bias voltage generating unit 120 is coupled to the bias node A. In one example embodiment, a resistor R1 may be coupled to the drain terminal of the MOS transistor Ma.

The bias voltage generating unit 120 includes a diode Da, a resistor Ra that is serially coupled to the diode Da, and a bypass capacitor C23 that is parallel coupled to the diode Da and the resistor Ra. The bypass capacitor C23 is used to bypass an AC component.

The operation of the fine tuning circuit 100 in FIG. 4 will be described.

When the voltage-controlled oscillator enable signal EN is turned on to perform the fine tuning, the MOS transistor Ma of the center bias unit 110 is turned on so that a current I flows to the bias voltage generating unit 120.

As the bias voltage generating unit 120 includes the diode Da and the resistor Ra, the voltage level of the bias node A may be determined by a threshold voltage VDath of the diode Da, the current I and the resistance of the resistor Ra and thus, represented by the following expression 1.

$$VA = VDath + I \times Ra \qquad \text{[Expression 1]}$$

For example, the threshold voltage VDath of the diode Da and the resistance of the resistor Ra may be determined such that a voltage level Va of the bias node A becomes +VDD/2. For example, when the VDD is 2.8V, the threshold voltage VDath of the diode Da and the resistance of the resistor Ra may have a value such that the voltage level Va of the bias node A is +1.4V.

When the tuning voltage Vtune is applied to the first tuning voltage inputting terminal 8 between the first varactor Cv21 and the first blocking capacitor C21, the capacitance of the first varactor Cv21 may be varied according to the tuning voltage Vtune. Similarly, when the tuning voltage Vtune is applied to the second tuning voltage inputting terminal 9 between the second varactor Cv22 and the second blocking capacitor C22, the capacitance of the second varactor Cv22 may be varied according to the tuning voltage Vtune.

The tuning voltage Vtune may have a voltage level ranging between a ground voltage and the power supply voltage VDD. For example, the power supply voltage VDD may have a voltage level of about 2.8V.

Therefore, when the tuning voltage Vtune having a voltage level between about 0V and about 2.8V is applied to the first and second varactors Cv21 and Cv22 and the voltage level of the bias node Va has a voltage level of 1.4V, the capacitances of the first and second varactors Cv21 and Cv22 may be varied according to the voltage difference between the tuning voltage Vtune and the voltage at the bias node A, i.e., −1.4V (0V-1.4V) to +1.4V (2.8V-1.4V). Therefore, according to an example embodiment of the present invention, nearly all the capacitance tuning range of the AMOS varactor illustrated in the tuning characteristic graph of FIG. 2 may be available.

Furthermore, by using the first and second blocking capacitors C21 and C22, the DC component outputted from the first and second output terminals 1 and 2 may not be transmitted to the first and second varactors Cv21 and Cv22. Consequently, the performance of the varactors Cv21 and Cv22 may be improved and the fine tuning may be performed stably.

The bias voltage generating unit 120 may be implemented using the diode Da and the resistor Ra as described in FIG. 4. Alternatively, the bias voltage generating unit 120 may be implemented using a diode only or a resistor only.

Figure 5:
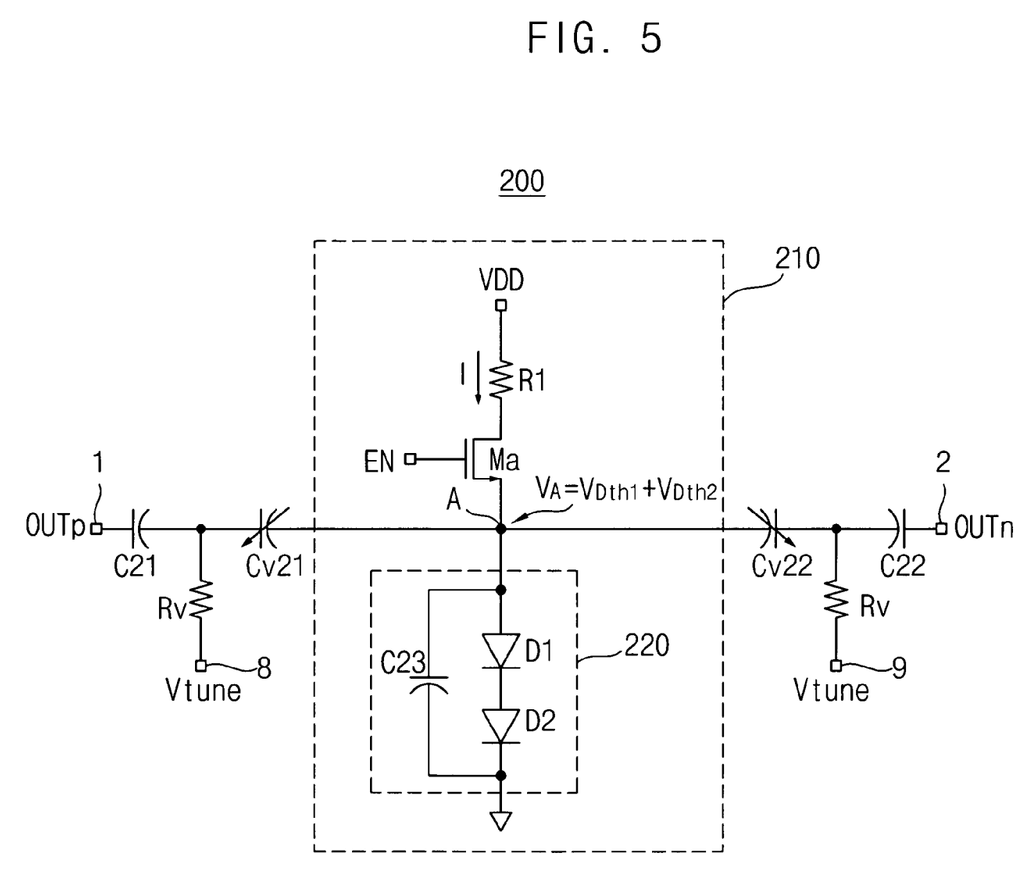
FIG. 5 is a circuit diagram illustrating a fine tuning circuit according to an example embodiment of the present invention.

FIG. 5 is a circuit diagram illustrating a fine tuning circuit 200 according to another example embodiment of the present invention.

Referring to FIG. 5, a bias voltage generating unit 220 of the center bias unit 210 includes a first diode D1 and a second diode D2. The voltage level of the bias node A is determined by a summation of a threshold voltage VDth1 of the first diode D1 and a threshold voltage VDth2 of the second diode D2 as represented by the following expression 2.

$$VA = VDth1 + VDth2 \qquad \text{[Expression 2]}$$

Figure 6:
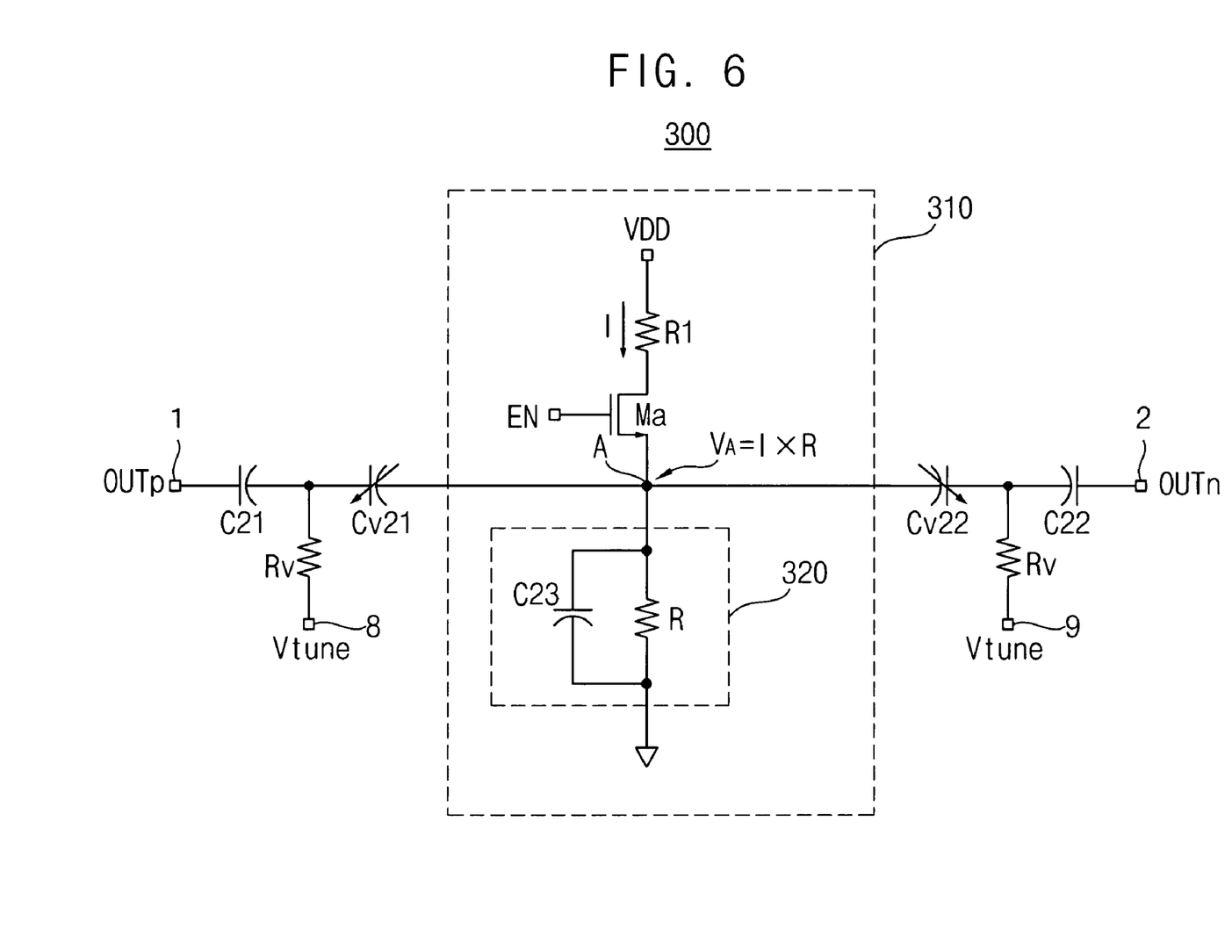
FIG. 6 is a circuit diagram illustrating a fine tuning circuit according to an example embodiment of the present invention.

FIG. 6 is a circuit diagram illustrating a fine tuning circuit 300 according to an example embodiment of the present invention.

Referring to FIG. 6, a bias voltage generating unit 320 of the center bias unit 310 includes a single resistor R. In this example embodiment, the voltage level VA of the bias node A may be determined by the current I flowing through the resistor R of the bias voltage generating unit 320 and the resistance of the resistor R, which is represented by the following expression 3.

$$VA = I \times R \qquad \text{[Expression 3]}$$

As described above, using the fine tuning devices 100, 200 and 300, the AMOS varactors Cv21 and Cv22 may have a full capacitance tuning range while the DC noise from the output terminals 1 and 2 are removed.

Further, a coarse tuning circuit that may adjust the oscillation of a frequency based on an input digital bit value is provided according to an example embodiment of the present invention. The coarse tuning circuit according to an example embodiment of the present invention will be described with reference to FIG. 7.

Figure 7:
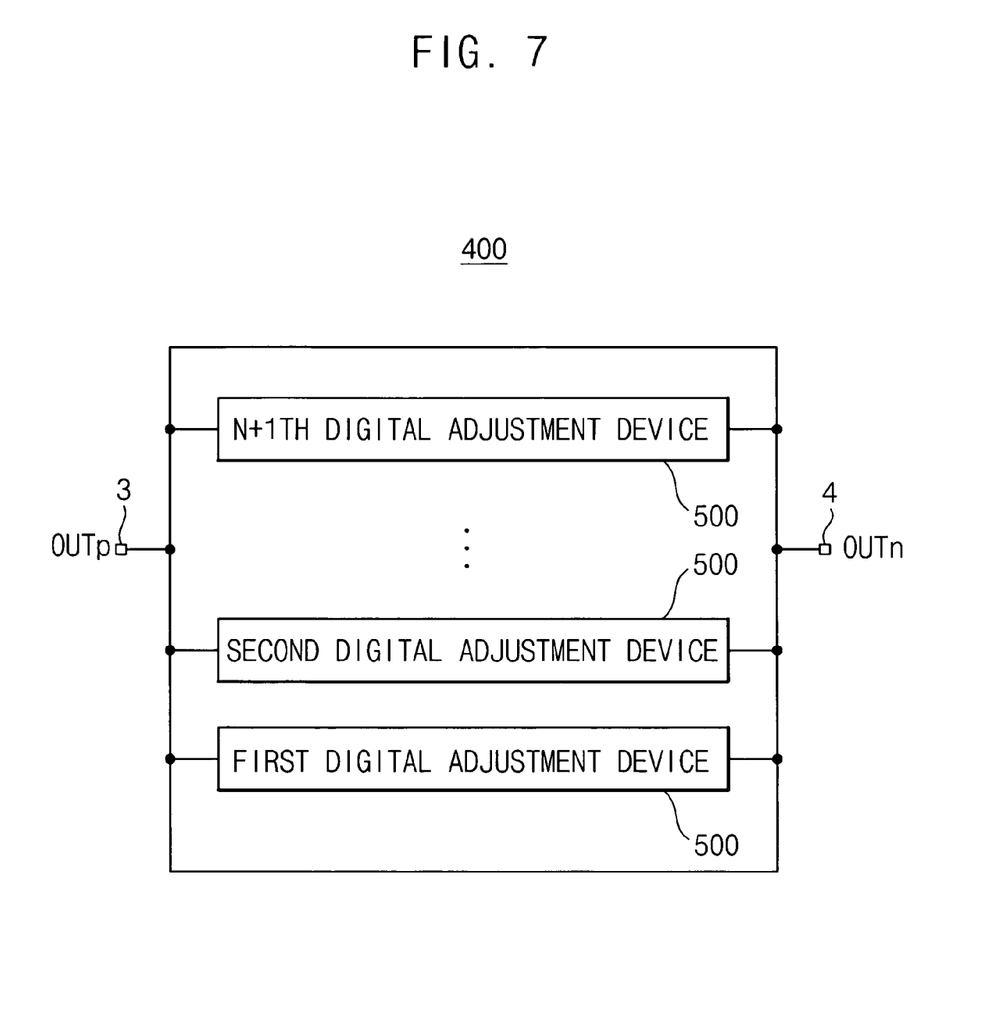
FIG. 7 is a schematic view illustrating a coarse tuning unit of a voltage-controlled oscillator.

Referring to FIG. 7, the coarse tuning unit 400 includes N+1 coarse tuning circuits 500, each of which corresponds to each bit of inputted N-bit digital data.

Each of the coarse tuning circuits 500 has a first terminal coupled to a first output terminal 3 and a second terminal coupled to a second output terminal 4. Each of the coarse tuning circuits 500 includes a varactor that is binary weighted according to a corresponding bit place of received digital data. For example, when the varactor of the coarse tuning circuit 500 that receives a data bit of a first bit place has a capacitance of $2^0 \times C$, the varactor of the coarse tuning circuit 500 that receives a data bit of an Nth place may have a capacitance of $2^{N-1} \times C$.

Figure 8:
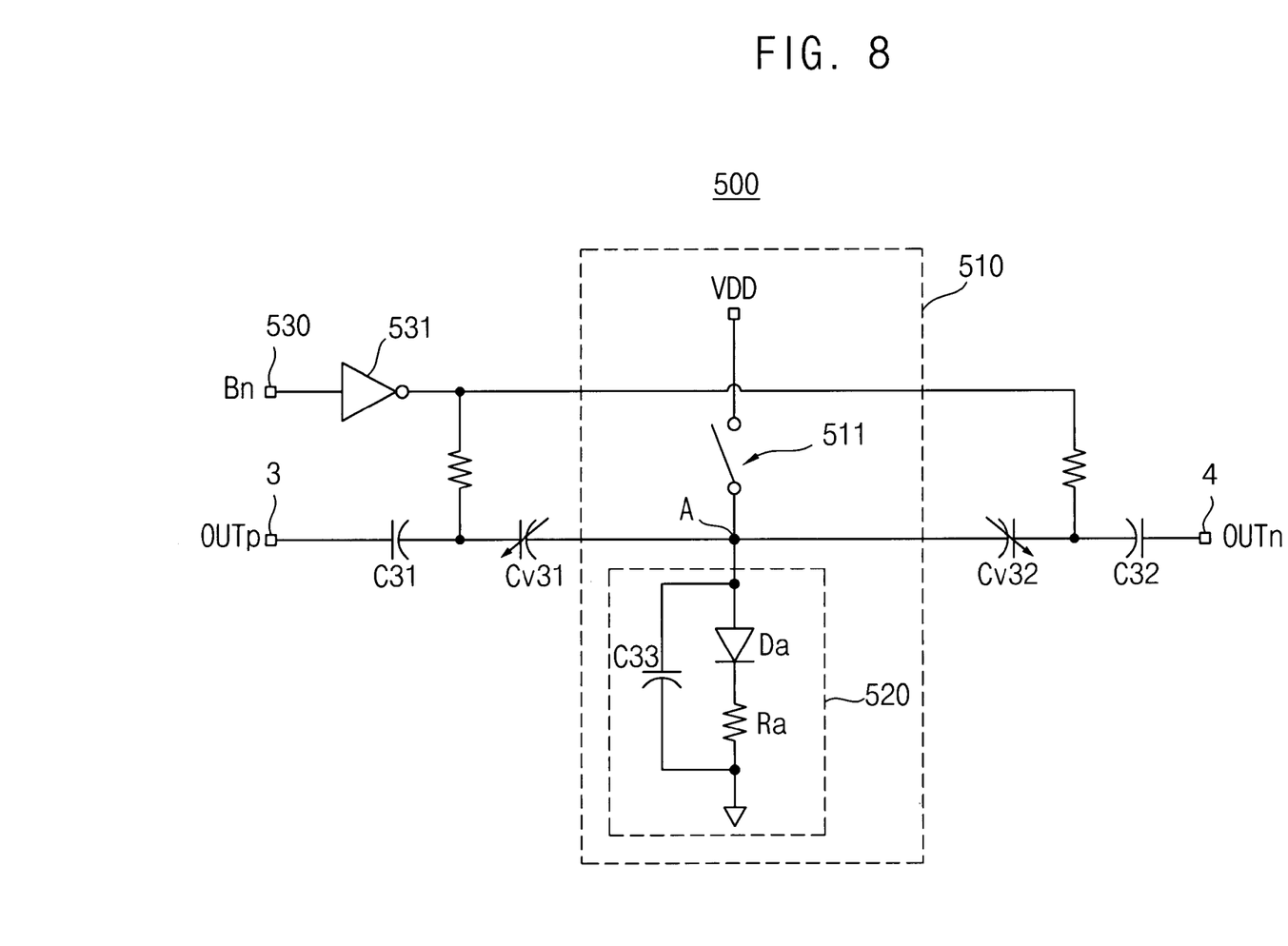
FIG. 8 is a circuit diagram illustrating the coarse tuning circuit in FIG. 7 according to an example embodiment of the present invention.

FIG. 8 is a circuit diagram illustrating the coarse tuning circuit of FIG. 7 according to an example embodiment of the present invention.

Referring to FIG. 8, the coarse tuning circuit 500 according to an example embodiment of the present invention includes a first blocking capacitor C31, a first varactor Cv31, a second blocking capacitor C32, a second varactor Cv32 and a center bias unit 510. For example, the first and second varactors Cv31 and Cv32 may include an AMOS varactor and the first and second blocking capacitors C31 and C32 may include an MIM capacitor.

The first varactor Cv31 is serially coupled to the first blocking capacitor C31. For instance, in this example embodiment, the first varactor Cv31 has a first terminal coupled to a second terminal of the first blocking capacitor C31 and a second terminal coupled to a second terminal of the second varactor Cv32.

A data input terminal 530 is electrically connected to a node where the first varactor Cv31 and the first blocking capacitor C31 are coupled. An input bit data Bn is inputted to the data input terminal 530 to adjust the capacitance of the first varactor Cv31.

The first blocking capacitor C31 has a second terminal electrically coupled to a first terminal of the first varactor Cv31 and a first terminal coupled to the first output terminal 3. Herein, the first blocking capacitor C31 may function to block a DC component outputted from the first output terminal 3 so that the first varactor Cv31 may not receive any noise.

The second varactor Cv32 is serially coupled to the second blocking capacitor C32. For example, in this example embodiment, the second varactor Cv32 has a first terminal coupled to a second terminal of the second blocking capacitor C32 and a second terminal coupled to a second terminal of the first varactor Cv31.

A data input terminal 530 is electrically connected to a node where the second varactor Cv32 and the second blocking capacitor C32 are coupled. An input bit data Bn is inputted to the data input terminal 530 to adjust the capacitance of the second varactor Cv32.

An inverter may be used to invert the input data bit Bn inputted through the data input terminal 530. Therefore, an inverted bit value Bn may be provided to the first and second varactors Cv31 and Cv32.

The second blocking capacitor C32 has a second terminal electrically coupled to a first terminal of the second varactor Cv32 and a first terminal coupled to the second output terminal 4. Herein, the second blocking capacitor C32 may function to block a DC component outputted from the second output terminal 4 so that the second varactor Cv32 may not receive any noise.

As described above, the first blocking capacitor C31 and the first varactor Cv31 form a symmetric structure and the second blocking capacitor C32 and the second varactor Cv32 form a symmetric structure.

A bias node A is formed between the first and second varactors Cv31 and Cv32. A voltage level of the bias node A is maintained constant by the center bias unit 510.

The center bias unit 510 may include a bias voltage generating unit 520 for determining a voltage level of the bias node A and a control switch 511 for controlling the supply of a power supply voltage VDD to the bias voltage generating unit 520. The control switch 511 may be turned on or off by a voltage-controlled oscillation enable signal.

The bias voltage generating unit 520 may include a diode Da, a resistor Ra that is serially coupled to the diode Da, and a bypass capacitor C33 that is parallel coupled to the diode Da and the resistor Ra. The bypass capacitor C33 is used to bypass an AC component.

The operation of the fine tuning circuit 500 in FIG. 8 will be described below.

When the control switch 511 of the center bias unit 510 is turned on, the power supply voltage VDD is provided to the bias voltage generating unit 520 so that a current I flows therethrough. As the bias voltage generating unit 520 includes the diode Da and the resistor Ra, the voltage at the bias node A may be determined by a threshold voltage VDath of the diode Da, the current I and the resistance of the resistor Ra, which is given as the above expression 1.

For example, the threshold voltage VDath of the diode Da and the resistance of the resistor Ra may be determined such that a voltage level Va of the bias node A becomes +VDD/2. For example, when the VDD is 2.8V, the threshold voltage VDath of the diode Da and the resistance of the resistor Ra may have a value such that the voltage level Va of the bias node A is +1.4V.

When the input bit value Bn having a logic high level voltage is inputted to the data input terminal 530, the input bit value Bn is inverted so that a logic low level signal is provided to the first and second varactors Cv31 and Cv32.

For example, a logic low level signal may have a voltage level of about a ground voltage, i.e., 0V and a logic high level signal may have a voltage level of about a power supply voltage VDD, e.g., 2.8V.

When the low level signal, e.g., 0V, is inputted to the first and second varactors Cv31 and Cv32, the capacitances of the first and second varactors Cv31 and Cv32 are determined by a voltage level of −VDD/2, e.g., about −1.4V (0V-1.4V), because the voltage level Va at the bias node A is maintained at about +1.4V.

When the input bit value Bn having a logic low level voltage is inputted to the data input terminal 530, the input bit value Bn is inverted so that a logic high level signal is provided to the first and second varactors Cv31 and Cv32.

When the high level signal, e.g., about 2.8V, is inputted to the first and second varactors Cv31 and Cv32, the capacitances of the first and second varactors Cv31 and Cv32 are determined by a voltage level of +VDD/2, e.g., about +1.4V (2.8V-1.4V), because the voltage level Va at the bias node A is maintained at about +1.4V.

In addition, by using the first and second blocking capacitors C31 and C32, the DC component outputted from the first and second output terminals 3 and 4 may not be transmitted to the first and second varactors Cv31 and Cv32.

Moreover, the bias voltage generating unit 520 may be implemented using the diode Da and the resistor Ra as described in FIG. 8. Alternatively, the bias voltage generating unit 520 may be implemented using a diode only or a resistor only.

Figure 9:
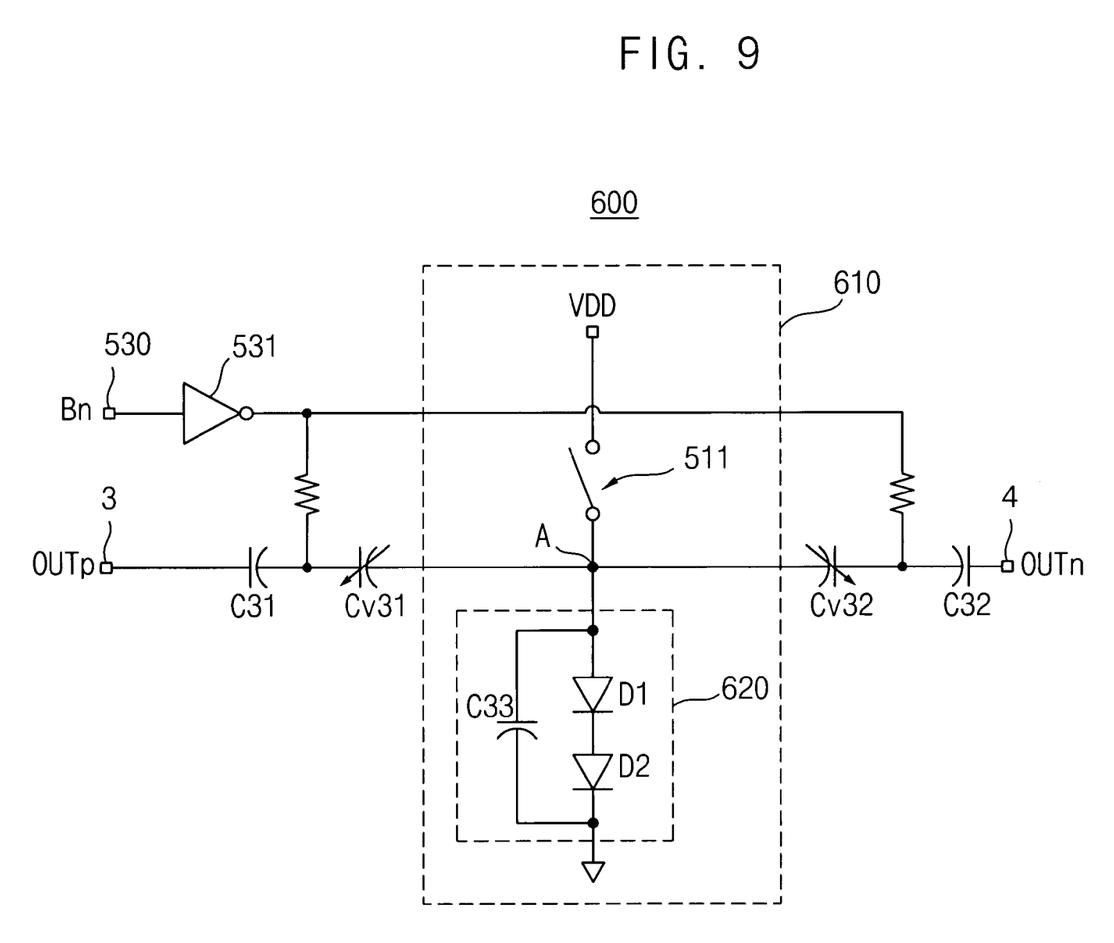
FIG. 9 is a circuit diagram illustrating the coarse tuning circuit in FIG. 7 according to an example embodiment of the present invention.

FIG. 9 is a circuit diagram illustrating the coarse tuning circuit in FIG. 7 according to another example embodiment of the present invention.

Referring to FIG. 9, in a coarse tuning circuit 600, a bias voltage generating unit 620 of the center bias unit 610 includes a first diode D1 and a second diode D2. The bias voltage generating unit 620 may further include a bypass capacitor C33 that is parallel coupled to the first and second diodes D1 and D2 to bypass an AC component. The voltage level Va at the bias node A is determined by a sum of the threshold voltage VDth1 of the first diode D1 and the threshold voltage VDth2 of the second diode D2, which is given as the above expression 2.

Figure 10:
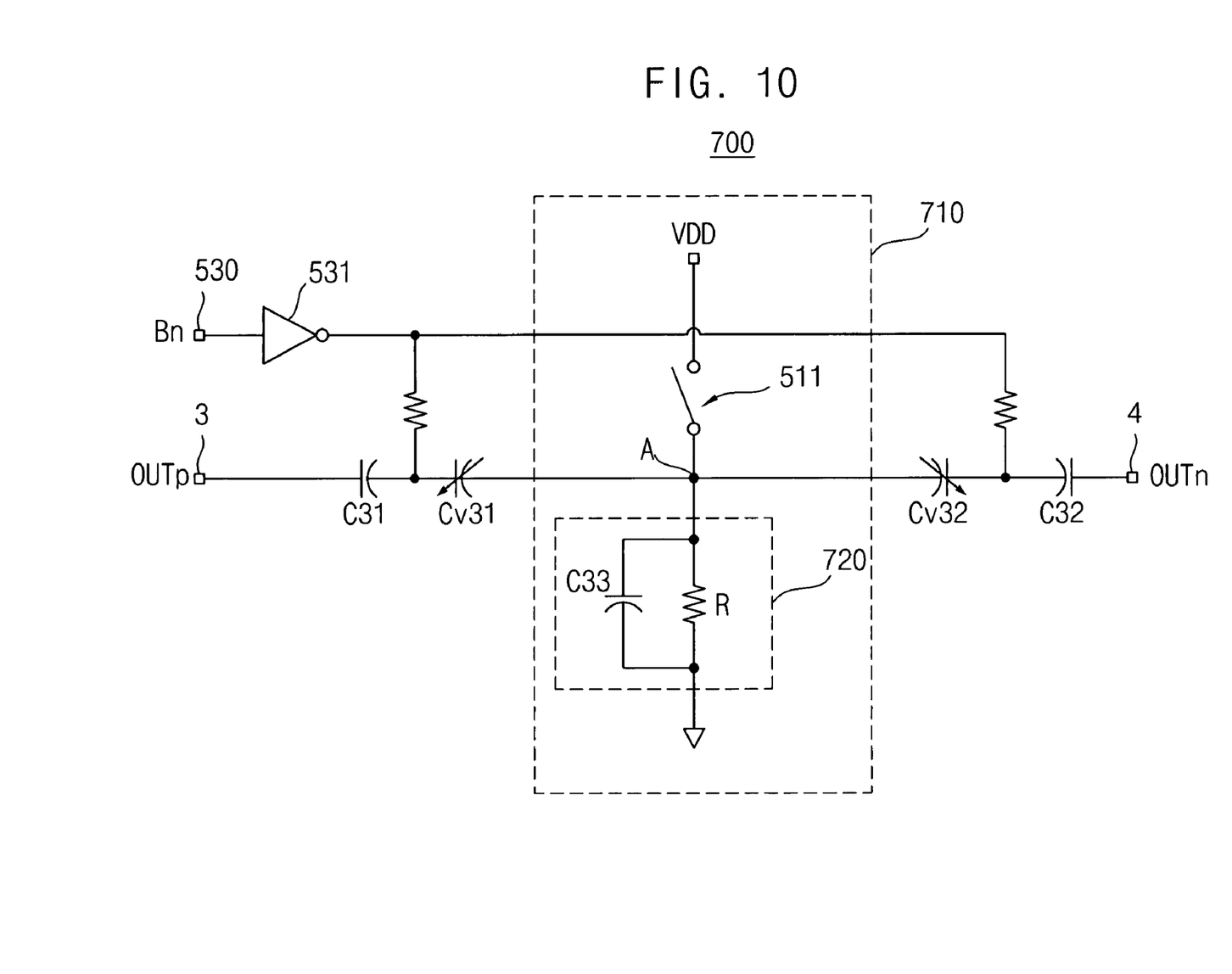
FIG. 10 is a circuit diagram illustrating the coarse tuning circuit in FIG. 7 according to an example embodiment of the present invention.

FIG. 10 is a circuit diagram illustrating the coarse tuning circuit in FIG. 7 according to another example embodiment of the present invention.

Referring to FIG. 10, in a course tuning circuit 700, a bias voltage generating unit 720 of the center bias unit 710 includes a single resistor R. The bias voltage generating unit 720 may further include a bypass capacitor C33 that is parallel coupled to the resistor R to bypass an AC component. In this case, the voltage level Va at the bias node A is determined by the current I flowing through the resistor R and the resistance of the resistor R, which is given as the above expression 3.

The fine tuning circuits 100, 200 and 300 in FIGS. 4 through 6 and the coarse tuning circuits 500, 600 and 700 in FIGS. 8 through 10 may be easily applied to a voltage-controlled oscillator.

Figure 11:
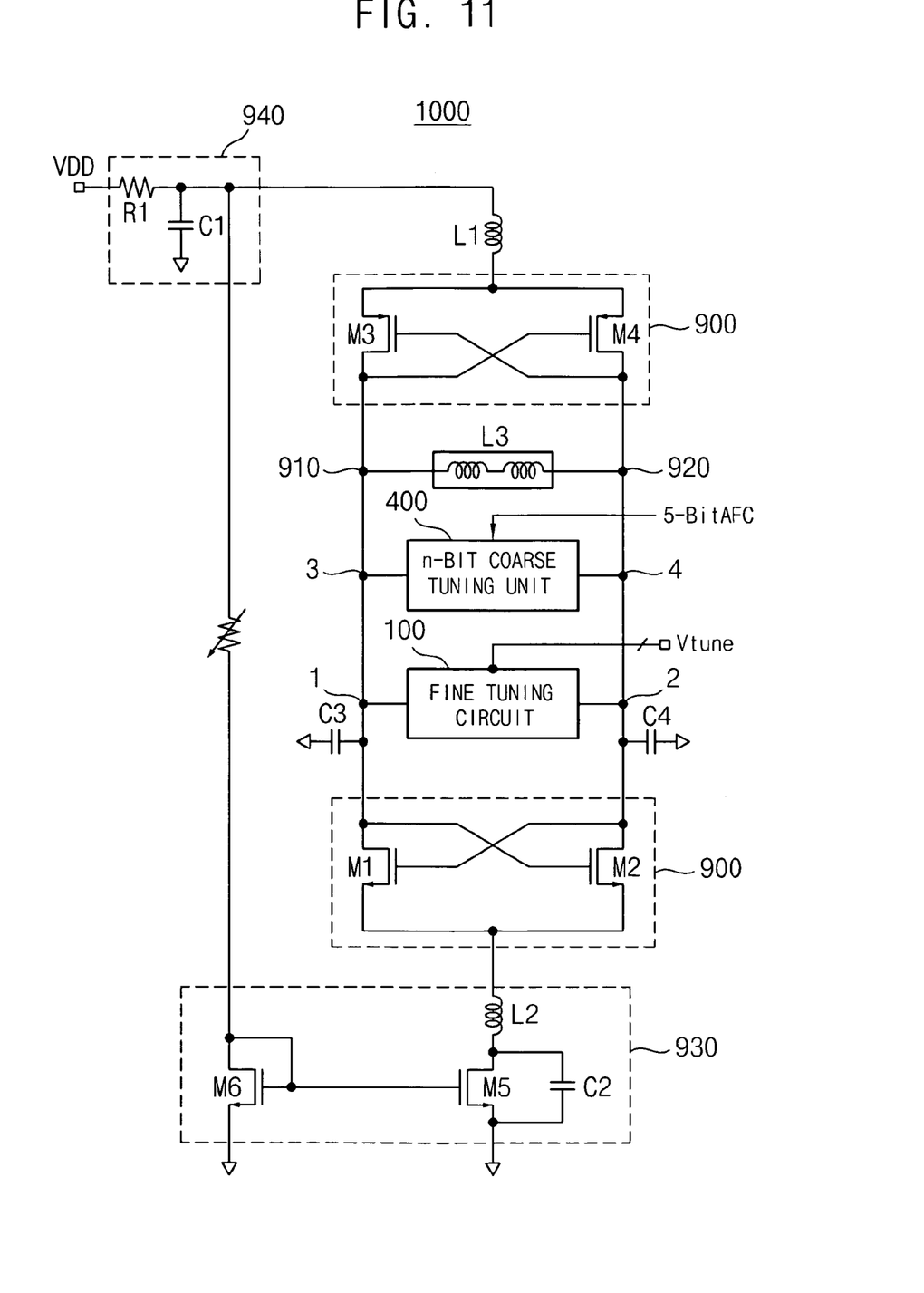
FIG. 11 is a circuit diagram illustrating a voltage-controlled oscillator having the fine tuning circuit as shown in FIG. 4, and the coarse tuning circuit as shown in FIG. 7, according to an example embodiment of the present invention.

FIG. 11 is a circuit diagram illustrating a voltage-controlled oscillator 1000 having the fine tuning circuit 100 in FIG. 4 and the coarse tuning unit 400 in FIG. 7 according to an example embodiment of the present invention.

Referring to FIG. 11, in the voltage-controlled oscillator 1000, first and second output terminals 1 and 2 of the fine tuning circuit 100 are coupled to first and second output terminals 3 and 4 of the coarse tuning unit 400, respectively, and the first and second output terminals 3 and 4 of the coarse tuning unit 400 are coupled to first and second oscillation nodes 910 and 920 of an active circuit 900, respectively. An inductor L3 may be disposed between the first and second oscillation nodes 910 and 920 so that a frequency oscillation may occur through an LC resonance.

The active circuit 900 may include a pair of cross-coupled transistors M3 and M4 to generate a negative transconductor for frequency oscillation. The voltage-controlled oscillator 100 may further include a bias circuit 930 comprising MOS transistors M5 and M6, an inductor L2, a capacitor C2, and a low pass filter 940 comprising a resistor R1 and a capacitor C1.

As described above, according to the example embodiments of the present invention, a bias node where two varactors of the fine tuning circuit are coupled may be maintained at a particular voltage level, for example, +VDD/2, so that the fine tuning circuit may have an increased capacitance tuning range of the AMOS varactor. In addition, by using a blocking capacitor disposed between an output terminal and the varactor, an unnecessary DC component may be removed so that the frequency tuning is stably performed and the performance of a voltage-controlled oscillator is improved.

Having described the example embodiments of the present invention, it is further noted that it is readily apparent to those of reasonable skill in the art that various modifications may be made without departing from the spirit and scope of the invention which is defined by the metes and bounds of the appended claims.

What is claimed is:

1. A frequency fine tuning circuit for use in a voltage-controlled oscillator, comprising:
   a first varactor;
   a second varactor coupled to the first varactor at a first node; and
   a center bias unit configured to maintain a node voltage of the first node at a constant bias voltage level, the constant bias voltage level substantially corresponding to a mean value of a range of a tuning voltage, wherein the center bias unit comprises:
   a bias voltage generating unit coupled to the first node, the bias voltage generating unit configured to determine a voltage level of the first node; and
   a switch unit configured to supply a power supply voltage to the bias voltage generating unit in response to a voltage-controlled oscillation enable signal that is externally provided.

2. The frequency fine tuning circuit of claim 1, wherein the first and second varactors comprise accumulation MOS (AMOS) varactors.

3. The frequency fine tuning circuit of claim 1, further comprising:
   a first blocking capacitor coupled between a first output terminal and the first varactor, the first blocking capacitor configured to prevent noise from being transmitted to the first varactor; and
   a second blocking capacitor coupled between a second output terminal and the second varactor, the second blocking capacitor configured to prevent noise from being transmitted to the second varactor.

4. The frequency tuning circuit of claim 3, wherein the first and second blocking capacitors comprise insulator metal (MIM) capacitors.

5. The frequency fine tuning circuit of claim 3, wherein the first varactor has a first terminal electrically coupled to a second terminal of the first blocking capacitor, and a second terminal electrically coupled to a second terminal of the second varactor.

6. The frequency fine tuning circuit of claim 3, wherein a first tuning voltage inputting terminal for providing the tuning voltage is electrically coupled to a node where the first blocking capacitor and the first varactor are coupled, and wherein the first varactor is configured to have a capacitance varied according to the tuning voltage.

7. The frequency fine tuning circuit of claim 3, wherein the second varactor has a first terminal electrically coupled to a second terminal of the second blocking capacitor, and a second terminal electrically coupled to a second terminal of the first varactor.

8. The frequency fine tuning circuit of claim 3, wherein a second tuning voltage inputting terminal for providing the tuning voltage is electrically coupled to a node where the second blocking capacitor and the second varactor are coupled, and wherein a capacitance of the second varactor is varied according to the tuning voltage.

9. The frequency fine tuning circuit of claim 1, wherein the switch unit includes a MOS transistor, the MOS transistor having a first terminal coupled to the power supply voltage, a second terminal coupled to the first node, and a control terminal for receiving the voltage-controlled oscillation enable signal EN.

10. The frequency fine tuning circuit of claim 1, wherein the bias voltage generating unit includes a diode and a resistor that are serially coupled to each other.

11. The frequency fine tuning circuit of claim 1, wherein the bias voltage generating unit comprises at least one diode serially coupled.

12. The frequency fine tuning circuit of claim 1, wherein the bias voltage generating unit comprises a resistor.

13. The frequency fine tuning circuit of claim 1, wherein the bias voltage generating unit further comprises a bypass capacitor configured to bypass an AC component.

14. A frequency coarse tuning circuit for use in a voltage-controlled oscillator, comprising:
   a first varactor configured to have a capacitance varied according to a bit value that is externally inputted;
   a first blocking capacitor coupled between a first output terminal and the first varactor, the first blocking capacitor configured to prevent noise from being transmitted to the first varactor;
   a second varactor configured to have a capacitance varied according to the bit value that is externally inputted, the second varactor being coupled to the first varactor at a first node;
   a second blocking capacitor coupled between a second output terminal and the second varactor, the second blocking capacitor configured to prevent noise from being transmitted to the second varactor; and
   a center bias unit configured to maintain a node voltage of the first node at a constant bias voltage level, the constant bias voltage level substantially corresponding to a mean value of a range of a tuning voltage, wherein the center bias unit comprises:
   a bias voltage generating unit coupled to the first node, the bias voltage generating unit configured to determine a voltage level of the first node; and
   a switch unit configured to supply a power supply voltage to the bias voltage generating unit in response to a voltage-controlled oscillation enable signal that is externally provided.

15. The frequency coarse tuning circuit of claim 14, wherein the first and second varactors comprise accumulation MOS (AMOS) varactors.

16. The frequency coarse tuning circuit of claim 14, wherein the first and second blocking capacitors comprise metal-insulator-metal (MIM) capacitors.

17. The frequency coarse tuning circuit of claim 14, wherein the first varactor has a first terminal electrically coupled to a second terminal of the first blocking capacitor, and a second terminal electrically coupled to a second terminal of the second varactor.

18. The frequency coarse tuning circuit of claim 14, wherein a first data input terminal is coupled to a node where the first varactor and the first blocking capacitor are coupled, and wherein the first data input terminal is configured to receive the bit value when inputted therethrough.

19. The frequency coarse tuning circuit of claim 18, wherein the first data input terminal is coupled to an inverter so that an inverted bit value is outputted.

20. The frequency coarse tuning circuit of claim 14, wherein the second varactor has a first terminal electrically coupled to a second terminal of the second blocking capacitor and a second terminal electrically coupled to a second terminal of the first varactor.

21. The frequency coarse tuning circuit of claim 14, wherein a second data input terminal is coupled to a node where the second varactor and the second blocking capacitor are coupled, and wherein the second data input terminal is configured to receive the bit value when inputted therethrough.

22. The frequency coarse tuning circuit of claim 21, wherein the second data input terminal is coupled to an inverter so that an inverted bit value is outputted.

23. The frequency coarse tuning circuit of claim 14, wherein the bias voltage generating unit comprises a diode and a resistor that are serially coupled to each other.

24. The frequency coarse tuning circuit of claim 14, wherein the bias voltage generating unit comprises at least one diode serially coupled.

25. The frequency coarse tuning circuit of claim 14, wherein the bias voltage generating unit comprises a resistor.

26. The frequency fine tuning circuit of claim 14, wherein the bias voltage generating unit further comprises a bypass capacitor configured to bypass an AC component.

27. The frequency coarse tuning circuit of claim 14, wherein a logic low level of the bit value corresponds to a ground voltage level and a logic high level of the bit value corresponds to a power supply voltage level.

28. A voltage-controlled oscillator comprising:
an active circuit having a first oscillation node and a second oscillation node;
an inductor coupled between the first and second oscillation nodes; and
a fine tuning circuit coupled between the first and second oscillation nodes, wherein the fine tuning circuit comprises:
a first varactor configured to have a capacitance varied according to a tuning voltage that is externally provided;
a second varactor configured to have a capacitance varied according to the tuning voltage, the second varactor being coupled to the first varactor at a first node; and
a center bias unit configured to maintain a node voltage of the first node at a constant bias voltage level, the constant bias voltage level substantially corresponding to a mean value of a range of the tuning voltage, wherein the center bias unit comprises:
a bias voltage generating unit coupled to the first node, the bias voltage generating unit configured to determine a voltage level of the first node; and
a switch unit configured to supply a power supply voltage to the bias voltage generating unit in response to a voltage-controlled oscillation enable signal that is externally provided.

29. The voltage-controlled oscillator of claim 28, wherein the fine tuning circuit further comprises:
a first blocking capacitor coupled between the first oscillation node and the first varactor, the first blocking capacitor configured to prevent noise from being transmitted to the first varactor; and
a second blocking capacitor coupled between the second oscillation node and the second varactor, the second blocking capacitor configured to prevent noise from being transmitted to the second varactor.

30. The voltage-controlled oscillator of claim 28, wherein the tuning voltage ranges from a ground voltage level to a power supply voltage level.

31. A voltage-controlled oscillator comprising:
an active circuit having a first oscillation node and a second oscillation node;
an inductor coupled between the first and second oscillation nodes; and
at least one coarse tuning circuit coupled between the first and second oscillation nodes, wherein the at least one coarse tuning circuit comprises:
a first varactor configured to have a capacitance varied according to a bit value externally provided;
a second varactor configured to have a capacitance varied according to the bit value, the second varactor being coupled to the first varactor at a first node; and
a center bias unit configured to maintain a node voltage of the first node at a constant bias voltage level, the constant bias voltage level substantially corresponding to a mean value of a range of the tuning voltage, wherein the center bias unit comprises:
a bias voltage generating unit coupled to the first node, the bias voltage generating unit configured to determine a voltage level of the first node; and
a switch unit configured to supply a power supply voltage to the bias voltage generating unit in response to a voltage-controlled oscillation enable signal that is externally provided.

32. The voltage-controlled oscillator of claim 31, wherein each of the at least one coarse tuning circuit further comprises:
a first blocking capacitor coupled between the first oscillation node and the first varactor, the first blocking capacitor configured to prevent noise from being transmitted to the first varactor; and
a second blocking capacitor coupled between the second oscillation node and the second varactor, the second blocking capacitor configured to prevent noise from being transmitted to the second varactor.

33. The voltage-controlled oscillator of claim 31, wherein a logic low level of the bit value corresponds to a ground voltage level and a logic high level of the bit value corresponds to a power supply voltage level.

* * * * *